(12) United States Patent
Song et al.

(10) Patent No.: US 9,953,601 B2
(45) Date of Patent: Apr. 24, 2018

(54) BENDING ACTION RECOGNITION DEVICE AND FLEXIBLE DISPLAY DEVICE

(71) Applicant: BOE TECHNOLOGY GROUP CO., LTD., Beijing (CN)

(72) Inventors: Song Song, Beijing (CN); Shiming Shi, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 57 days.

(21) Appl. No.: 14/786,053

(22) PCT Filed: Apr. 20, 2015

(86) PCT No.: PCT/CN2015/077006
§ 371 (c)(1),
(2) Date: Oct. 21, 2015

(87) PCT Pub. No.: WO2016/078319
PCT Pub. Date: May 26, 2016

(65) Prior Publication Data
US 2016/0335969 A1 Nov. 17, 2016

(30) Foreign Application Priority Data
Nov. 19, 2014 (CN) .......................... 2014 1 0666125

(51) Int. Cl.
*G09G 5/00* (2006.01)
*G09G 3/36* (2006.01)
(Continued)

(52) U.S. Cl.
CPC .......... *G09G 3/3655* (2013.01); *G06F 1/1652* (2013.01); *G06F 3/03* (2013.01);
(Continued)

(58) Field of Classification Search
CPC .......... G09G 3/3655; G09G 3/20; G09G 3/36; G09G 2300/0426; G09G 2354/00;
(Continued)

(56) References Cited

U.S. PATENT DOCUMENTS

2003/0227441 A1* 12/2003 Hioki .................... G06F 3/0412
345/156
2007/0085845 A1 4/2007 Kikuchi et al.
(Continued)

FOREIGN PATENT DOCUMENTS

CN        203397328 U    1/2014
CN        104392981 A    3/2015

OTHER PUBLICATIONS

International Search Report dated Aug. 24, 2015 corresponding to International application No. PCT/CN2015/077008.

*Primary Examiner* — Matthew Sim
(74) *Attorney, Agent, or Firm* — Nath, Goldberg & Meyer; Joshua B. Goldberg; Annie J. Kock

(57) ABSTRACT

The present invention discloses a bending action recognition device and a flexible display device, the bending action recognition device comprises: a first electrode, a second electrode, a current detecting unit and a plurality of electrical conductors, a first voltage is applied on the first electrode, a second voltage is applied on the second electrode, first ends of all the electrical conductors are connected to the first electrode, different electrical conductors are located at different positions on the flexible substrate, and different electrical conductors have different resistances; when the flexible substrate is bent backward, at least one electrical conductor is electrically connected to the second electrode, and a first current is generated on the first electrode and the second electrode, and when different electrical conductors
(Continued)

are electrically connected to the second electrode, the first current has different current values.

13 Claims, 4 Drawing Sheets

(51) Int. Cl.
  *G09F 9/35* (2006.01)
  *G06F 1/16* (2006.01)
  *G06F 3/03* (2006.01)
  *G09G 3/20* (2006.01)
(52) U.S. Cl.
  CPC ................ *G09F 9/35* (2013.01); *G09G 3/20* (2013.01); *G09G 3/36* (2013.01); *G09G 2300/0426* (2013.01); *G09G 2354/00* (2013.01); *G09G 2380/02* (2013.01); *H01L 2924/0002* (2013.01)
(58) Field of Classification Search
  CPC ................ G09G 2380/02; G09F 9/35; H01L 2924/0002; G06F 3/03; G06F 1/1652
  See application file for complete search history.

(56) References Cited

U.S. PATENT DOCUMENTS

| | | |
|---|---|---|
| 2009/0219247 A1 | 9/2009 | Watanabe et al. |
| 2014/0055429 A1 | 2/2014 | Kwon et al. |

* cited by examiner

US 9,953,601 B2

BENDING ACTION RECOGNITION DEVICE AND FLEXIBLE DISPLAY DEVICE

This is a National Phase Application filed under 35 U.S.C. 371 as a national stage of PCT/CN2015/077006, filed Apr. 20, 2015, an application claiming the benefit of Chinese Application No. 201410666125.8, filed Nov. 19, 2014, the content of each of which is hereby incorporated by reference in its entirety.

FIELD OF THE INVENTION

The present invention relates to the field of display technology, and particularly relates to a bending action recognition device and a flexible display device.

BACKGROUND OF THE INVENTION

Currently, thin film transistor-liquid crystal displays (TFT-LCD for short), due to their advantages of ultra-thinness and lightness, have gradually replaced conventional cathode ray tube (CRT for short) displays and become the mainstream in display technology. Among TFT-LCDs, flexible display panels have characteristics such as bendability and ultra-thinness, and therefore the manufacture and development thereof become the present research hotspot. However, inventors found that, in a flexible display panel in the prior art, bent portion thereof cannot be recognized.

SUMMARY OF THE INVENTION

The present invention provides a bending action recognition device and a flexible display device, which can be used for recognizing bent portion of the flexible substrate.

In order to achieve the above object, the present invention provides a bending action recognition device comprising a first electrode, a second electrode, a current detecting unit and a plurality of electrical conductors, the first electrode, the second electrode and the electrical conductors are all arranged on the back of a flexible substrate, a first voltage is applied on the first electrode, a second voltage is applied on the second electrode, first ends of all the electrical conductors are connected to the first electrode, different electrical conductors are located at different positions on the flexible substrate, and different electrical conductors have different resistance values;

when the flexible substrate is bent backward, at least one electrical conductor is electrically connected to the second electrode, and a first current is generated on the first electrode and the second electrode, and when different electrical conductors are electrically connected to the second electrode, the first current has different current values; and the current detecting unit is connected to the first electrode or the second electrode, the current detecting unit is used for detecting the first current on the first electrode or the second electrode, and the bending action recognition device recognizes bent portion of the flexible substrate according to the current value of the first current detected by the current detecting unit.

Optionally, the bending action recognition device further comprises: a third electrode, which is provided between the first electrode and the second electrode and is arranged on the back of the flexible substrate, a third voltage is applied on the third electrode, and the third voltage is not equal to the second voltage, and the current detecting unit is connected to the first electrode;

when the flexible substrate is not bent, the electrical conductors are electrically connected to the third electrode, and a second current is generated in the first electrode;

when the flexible substrate is bent backward, at least one electrical conductor is disconnected with the third electrode and is electrically connected to the second electrode, the second current in the first electrode is changed into a third current, and when different electrical conductors are electrically connected to the second electrode, the third current has different current values;

when the flexible substrate is bent forward, at least one electrical conductor is disconnected with both the third electrode and the second electrode, the second current in the first electrode is changed into a fourth current, and when different electrical conductors are disconnected with both the third electrode and the second electrode, the fourth current has different current values; and the bending action recognition device recognizes bent portion and bent direction of the flexible substrate according to the current value of the third current or the fourth current detected by the current detecting unit.

Optionally, the third voltage is less than the second voltage, and both the third voltage and the second voltage are greater than the first voltage.

Optionally, the third electrode is frame-shaped.

Optionally, the first electrode is located at an edge region of the flexible substrate, and the second electrode is located at a middle region of the flexible substrate.

Optionally, the first electrode is frame-shaped, and the second electrode is circular.

Optionally, the first electrode is frame-shaped, the second electrode comprises: a plurality of second sub-electrodes having the same number as the electrical conductors, and the second sub-electrodes extend towards corresponding electrical conductors, respectively.

Optionally, the electrical conductors are bar-shaped.

Optionally, the number of the electrical conductors is eight, the first ends of four of the electrical conductors are respectively connected to four vertices of the frame-shaped first electrode, the first ends of the other four electrical conductors are respectively connected to four midpoints on four sides of the frame-shaped first electrode, and second ends of the eight electrical conductors all point to the second electrode.

Optionally, the bending action recognition device further comprises limiting stoppers having the same number as the electrical conductors, wherein, the electrical conductors are in one-to-one correspondence with the limiting stoppers, the limiting stoppers are arranged on the back of the flexible substrate, a limiting groove is arranged on one side of each limiting stopper away from the flexible substrate, and the electrical conductors are located in the limiting grooves.

Optionally, the limiting stoppers are made of a flexible and insulating material, and the electrical conductors are made of a hard and conductive material.

Optionally, the bending action recognition device recognizes the bent portion of the flexible substrate based on a predetermined look-up table.

In order to achieve the above object, the present invention further provides a flexible display device, comprising a bending action recognition device, which is the above-described bending action recognition device.

The present invention has the beneficial effects as follows.

The present invention provides a bending action recognition device and a flexible display device, the bending action recognition device comprises: a first electrode, a second electrode, a current detecting unit and a plurality of electrical conductors. When the flexible substrate is not bent, no current is generated in the first electrode and the second electrode; when the flexible substrate is bent backward, a first current is generated on the first electrode and the second electrode. In the technical solution of the present invention, the current detecting unit is used to detect the first current on the first or second electrode, and the bent portion of the flexible substrate is determined according to the current value of the detected first current.

In addition, the present invention further provides another bending action recognition device, which comprises: a first electrode, a second electrode, a third electrode, a current detecting unit and a plurality of electrical conductors, and the third electrode is located between the first electrode and the second electrode. When the flexible substrate is not bent, the electrical conductors are electrically connected to the third electrode, the second current is generated in the first electrode; when the flexible substrate is bent backward, at least one electrical conductor is disconnected with the third electrode and is electrically connected to the second electrode, the second current in the first electrode is changed into the third current, and when different electrical conductors are electrically connected to the second electrode, the third current has different current values; when the flexible substrate is bent forward, at least one electrical conductor is disconnected with both the third electrode and the second electrode, the second current in the first electrode is changed into the fourth current, and when different electrical conductors are disconnected with both the third electrode and the second electrode, the fourth current has different current values. The current detecting unit recognizes bent portion and bent direction of the flexible substrate according to the current value of the third or fourth current.

DETAILED DESCRIPTION OF THE EMBODIMENTS

To enable those skilled in the art to better understand the technical solutions of the present invention, a bending action recognition device and a flexible display device provided by the present invention will be described in detail below in conjunction with the accompanying drawings.

Embodiment 1

Figure 1:
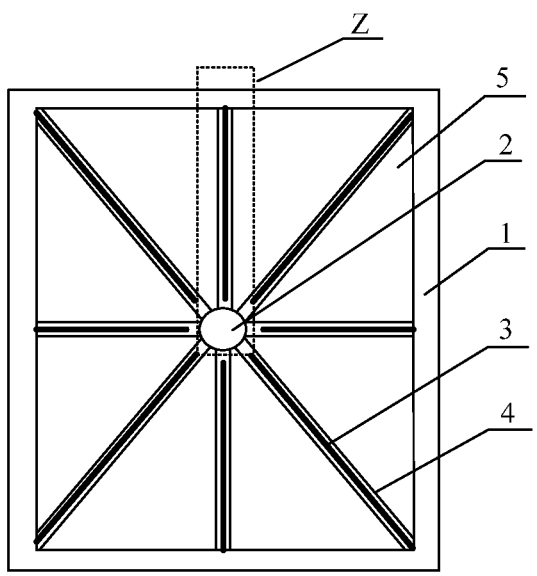
FIG. 1 is a schematic diagram of a structure of a bending action recognition device provided by Embodiment 1 of the present invention.

FIG. 1 is a schematic diagram of a structure of a bending action recognition device provided by Embodiment 1 of the present invention, and as shown in FIG. 1, the bending action recognition device comprises: a first electrode 1, a second electrode 2, a current detecting unit (not shown in FIG. 1) and a plurality of electrical conductors 3. The first electrode 1, the second electrode 2 and the electrical conductors 3 are all arranged on the back of a flexible substrate 5, a first voltage is applied on the first electrode 1, a second voltage is applied on the second electrode 2, first ends of all the electrical conductors 3 are connected to the first electrode 1, different electrical conductors 3 are located at different positions on the flexible substrate 5, and different electrical conductors 3 have different resistance values; when the flexible substrate 5 is bent backward, at least one electrical conductor 3 is electrically connected to the second electrode 2, and a first current is generated on the first electrode 1 and the second electrode 2, and when different electrical conductors 3 are electrically connected to the second electrode 2, the first current has different current values; the current detecting unit is connected to the first electrode 1 or the second electrode 2, and the current detecting unit is used for detecting the first current on the first electrode 1 or the second electrode 2, and recognizing bent portion of the flexible substrate 5 according to the current value of the detected first current.

It should be noted that, "different electrical conductors" in the above statement that "different electrical conductors 3 are electrically connected to the second electrode 2" in the present embodiment refer to electrical conductors 3 of different numbers and/or at different positions. The flexible substrate 5 in the present embodiment is any bendable product or component, such as a flexible substrate or a flexible display panel. In addition, the current detecting unit may be arranged on the back of the flexible substrate 5 or outside the flexible substrate 5.

In the present embodiment, since the first current has different current values when different electrical conductors 3 are connected to the second electrode 2, it can be determined which electrical conductor(s) 3 is(are) electrically connected to the second electrode 2 by using the current detecting unit to detect the first current on the first electrode 1 or the second electrode 2, and it is further determined that bend occurs at position(s) corresponding to the electrical conductor(s) 3 electrically connected to the second electrode 2.

Figure 2:
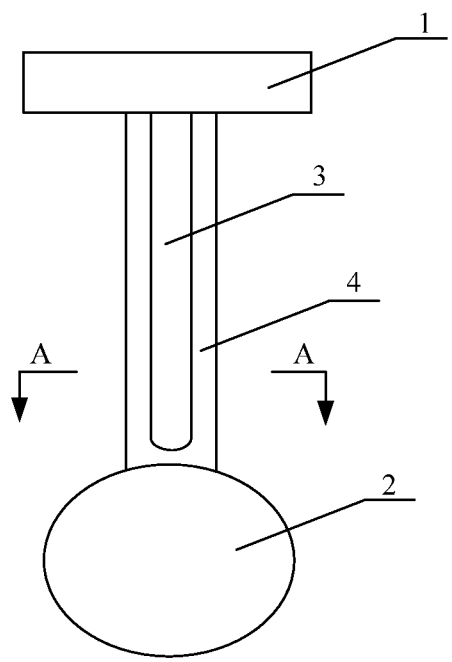
FIG. 2 is a partially enlarged view of structure Z in FIG. 1.
Figure 3:
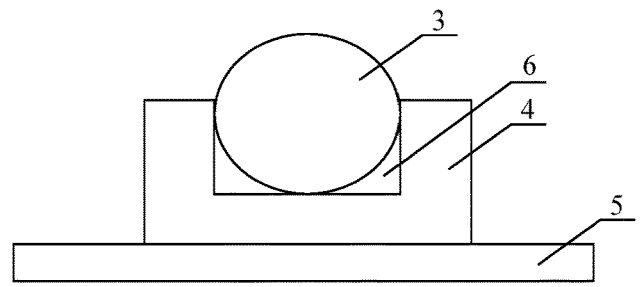
FIG. 3 is a schematic cross-sectional diagram taken along A-A direction in FIG. 2.

FIG. 2 is a partially enlarged view of structure Z in FIG. 1, FIG. 3 is a schematic cross-sectional diagram taken along A-A direction in FIG. 2, as shown in FIGS. 2 and 3, the first electrode 1 in the present embodiment is located at an edge region of the flexible substrate 5, and the second electrode 2 is located at a middle region of the flexible substrate 5. Optionally, the first electrode 1 is frame-shaped, the second electrode 2 is circular, and the second electrode 2 is located at the very center of the flexible substrate 5.

Referring to FIG. 1, further optionally, the electrical conductors 3 are bar-shaped, the number of the electrical conductors 3 is eight, the first ends of four of the electrical conductors 3 are respectively connected to four vertices of the frame-shaped first electrode 1, the first ends of the other four electrical conductors 3 are respectively connected to four midpoints on four sides of the frame-shaped first electrode 1, and all of the second ends of the eight electrical conductors 3 point to the second electrode. With eight electrical conductors 3 and the above positional arrangement, all regions on the flexible substrate 5 can be covered by using a small number of electrical conductors 3.

It should be noted that, the above description of eight electrical conductors 3 and positional arrangements for the eight electrical conductors 3 are just one preferable implementation of the present embodiment, but not limit the technical solution of the present invention.

In addition, limiting stoppers 4, having the same number as the electrical conductors, are arranged on the back of the flexible substrate 5, the electrical conductors 3 are in one-to-one correspondence with the limiting stoppers 4, the limiting stoppers 4 are arranged on the back of the flexible substrate 5, a limiting groove is arranged on one side of each limiting stopper 4 away from the flexible substrate 5, and the electrical conductors 3 are located in the limiting grooves. Here, the limiting stoppers 4 may be made of a flexible and insulating material, and the electrical conductors 3 may be made of a hard and conductive material.

Working principle of the bending action recognition device provided by the present embodiment will be described in detail below in conjunction with the accompanying drawings. Here, it is assumed that the current detecting unit is connected to the second electrode 2. It should be noted that, the technical solution in which the current detecting unit is connected to the second electrode 2 is just exemplary, but not limit the technical solution of the present invention.

Figure 4:
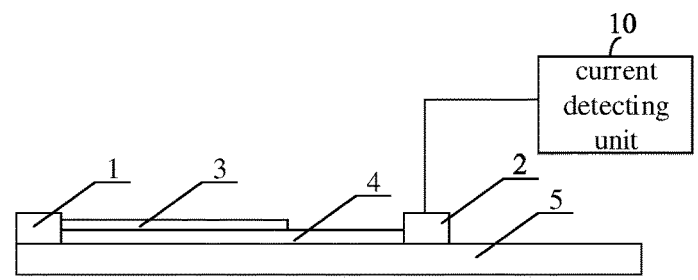
FIG. 4 is a schematic diagram of an electrical conductor and a second electrode when a flexible substrate is not bent in Embodiment 1.
Figure 5:
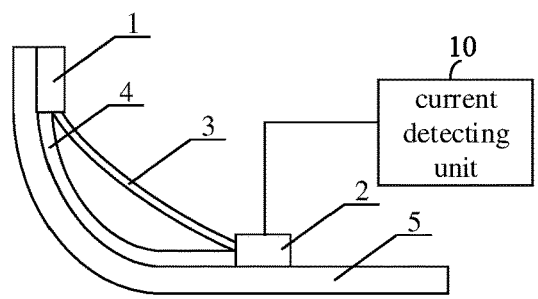
FIG. 5 is a schematic diagram of the electrical conductor and the second electrode when the flexible substrate is bent backward in Embodiment 1.

FIG. 4 is a schematic diagram of an electrical conductor and a second electrode when a flexible substrate is not bent in Embodiment 1, and FIG. 5 is a schematic diagram of the electrical conductor and the second electrode when the flexible substrate is bent backward in Embodiment 1. As shown in FIGS. 4 and 5, when the flexible substrate 5 is not bent, the electrical conductor 3 is located within the limiting groove 6, none of the electrical conductors 3 is electrically connected to the second electrode 2 (no closed circuit is formed), and at this time, no first current is detected at the current detecting unit 10 connected to the second electrode 2 (the current value of the first current is zero). When the flexible substrate 5 is bent backward, the limiting stopper 4 is bent accordingly, whereas the electrical conductors 3 keep bar-shaped (no deformation happens), and at least one electrical conductor 3 at corresponding position departs from the limiting groove 6 and is electrically connected to the second electrode 2. At this time, since two ends of the electrical conductor 3 form a loop and a voltage difference is generated at the two ends of the electrical conductor 3, a current is generated on the electrical conductor 3. When a plurality of electrical conductors 3 are electrically connected to the second electrode 2, the plurality of electrical conductors 3 exist in the circuit in the form of parallel connection, currents in the respective electrical conductors 3 are branch currents, and the first current in the second electrode 2 is a trunk current and is equal to the sum of the respective branch currents in magnitude.

In the present embodiment, connections between the electrical conductors 3 and the second electrode 2, respectively corresponding to the first currents of different magnitudes, may be obtained through experiments in advance, and a current-position correspondence table may be generated accordingly. After the current detecting unit 10 detects the first current, it can be known which electrical conductor(s) 3 is (are) electrically connected to the second electrode 2 by looking up a look-up table (i.e., the current-position correspondence table), so as to determine the bent position. The detected currents and the bent positions in the current-position correspondence table are unique values and correspond to each other. In the present embodiment, it is assumed that the number of the electrical conductors 3 is eight, the first current may have 256 different values (including the case that the first current value is 0) accordingly, that is, there are 256 different bending situations. For example, when the current value of the first current is 0, it means that there is no electrical conductor 3 electrically connected to the second electrode 2, and in this case, the flexible substrate 5 is unbent. When the current value of the first value is the maximum value among the above 256 values, it means that all of the electrical conductors 3 are electrically connected to the second electrode 2, and in this case, all regions, on which the electrical conductors 3 are provided, of the flexible substrate 5 are bent.

Figure 6:
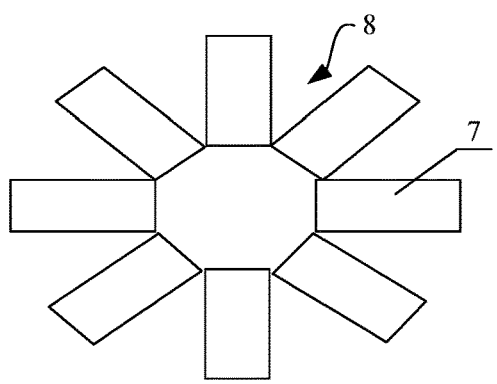
FIG. 6 is a schematic diagram of an alternative structure of the second electrode in Embodiment 1.

FIG. 6 is a schematic diagram of an alternative structure of the second electrode in Embodiment 1, and as shown in FIG. 6, the second electrode 2 in the present embodiment is not limited to be circular as shown in FIG. 1. Alternatively, the second electrode 2 comprises: second sub-electrodes 7 having the same number as the electrical conductors 3. All of the second sub-electrodes 7 are arranged in a petal-shaped manner, and the second sub-electrodes 7 which are arranged in a petal-shaped manner can rotate around its center. When bending action needs to be recognized, the second sub-electrodes are rotated such that the second sub-electrodes 7 are opposite to the electrical conductors 3; when there is no need to recognize bending action, the second sub-electrodes 7 are rotated such that spacer regions 8 between adjacent second sub-electrodes 7 are opposite to the electrical conductors 3, in this case, even if the flexible substrate 5 is bent, the electrical conductors 3 are located in the spacer regions 8 and cannot contact the second electrode 5, and the function of bending action recognition is disabled. On and off states of the bending action recognition device can be controlled by rotating the above second sub-electrodes 7 which is arranged in a petal-shaped manner, thus improving operability of the bending action recognition device.

Embodiment 1 of the present invention provides a bending action recognition device, which comprises: a first electrode, a second electrode, a current detecting unit and a plurality of electrical conductors. When the flexible substrate is not bent, no current is generated in the first electrode and the second electrode; when the flexible substrate is bent backward, a first current is generated on the first electrode and the second electrode. The technical solution of the present invention achieves recognition of the bending action of the flexible substrate by using the current detecting unit to detect the first current on the first or second electrode and recognizing the bent portion of the flexible substrate according to the current value of the detected first current.

Embodiment 2

Figure 7:
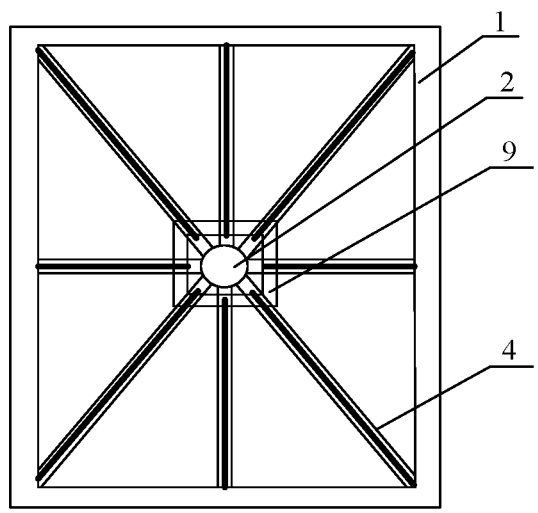
FIG. 7 is a schematic diagram of a structure of a bending action recognition device provided by Embodiment 2 of the present invention.

FIG. 7 is a schematic diagram of a structure of a bending action recognition device provided by Embodiment 2 of the present invention, and as shown in FIG. 7, the present embodiment differs from the above embodiment in that a third electrode 9 is further arranged on the back of the flexible substrate, the third electrode 9 is arranged between the first electrode 1 and the second electrode 2, and the current detecting unit (not shown in FIG. 7) is connected to the first electrode 1. Here, a third voltage is applied on the third electrode 9, and the third voltage is not equal to the second voltage. When the flexible substrate is not bent, the electrical conductors 3 are electrically connected to the third electrode 9, and a second current is generated in the first electrode 1; when the flexible substrate is bent backward, at least one electrical conductor 3 is disconnected with the third electrode 9 and is electrically connected to the second electrode 2, the second current in the first electrode 1 is changed into a third current, and when different electrical conductors 3 are electrically connected to the second electrode 2, the third current has different current values; when the flexible substrate 5 is bent forward, at least one electrical conductor 3 is disconnected with both the third electrode 9 and the second electrode 2, the second current in the first electrode 1 is changed into a fourth current, and when different electrical conductors 3 are disconnected with both the third electrode 9 and the second electrode 2, the fourth current has different current values; the current detecting unit is used for recognizing bent portion and bent direction of the flexible substrate 5 according to the current value of the third current or the fourth current.

In the present embodiment, optionally, the third electrode 9 is frame-shaped.

It can be seen from the above that the present embodiment can achieve recognition of both the bent portion and the bent direction of the flexible substrate 5. It should be noted that the technical solution in which the number of the electrical conductors 3 is eight is just exemplary, but not limit the technical solution of the present invention.

Working principle of the bending action recognition device provided by the present embodiment will be described in detail below in conjunction with the accompanying drawings.

Figure 8:
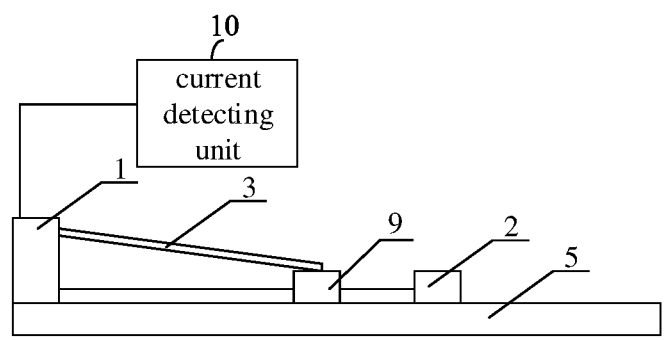
FIG. 8 is a schematic diagram of an electrical conductor, a first electrode and a second electrode when a flexible substrate is not bent in Embodiment 2.
Figure 9:
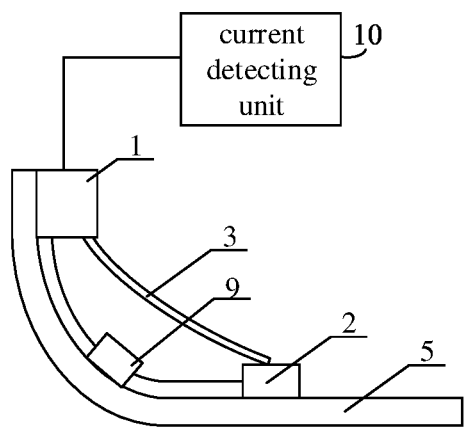
FIG. 9 is a schematic diagram of the electrical conductor, the first electrode and the second electrode when the flexible substrate is bent backward in Embodiment 2.
Figure 10:
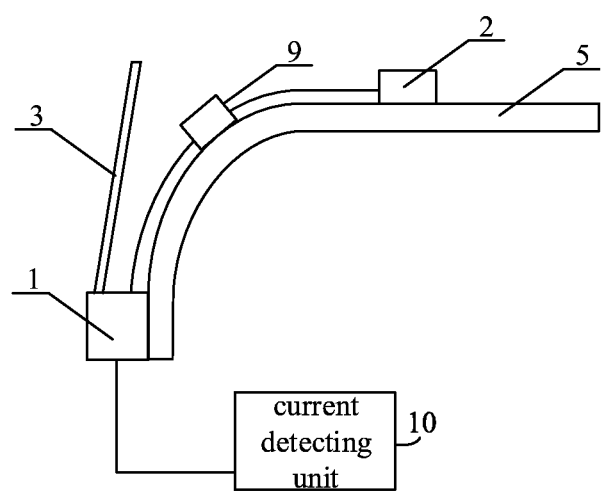
FIG. 10 is a schematic diagram of the electrical conductor, the first electrode and the second electrode when the flexible substrate is bent forward in Embodiment 2.

FIG. 8 is a schematic diagram of the electrical conductor, the first electrode and the second electrode when the flexible substrate is not bent in Embodiment 2, FIG. 9 is a schematic diagram of the electrical conductor, the first electrode and the second electrode when the flexible substrate is bent backward in Embodiment 2, and FIG. 10 is a schematic diagram of the electrical conductor, the first electrode and the second electrode when the flexible substrate is bent forward in Embodiment 2. As shown in FIGS. 8 to 10, when the flexible substrate 5 is not bent, the second ends of all the electrical conductors 3 are connected to the third electrode 9, two ends of each electrical conductor 3 form a loop, currents are generated in the electrical conductors 3, and all the electrical conductors 3 exist in the circuit in the form of parallel connection. In this case, the current in the first electrode detected by the current detecting unit 10 is the second current having a magnitude equal to a sum of the currents in all electrical conductors 3. When the flexible substrate 5 is bent backward, at least one electrical conductor 3 is disconnected with the third electrode 9, but is electrically connected to the second electrode 2. Since the second voltage in the second electrode 2 is different from the third voltage in the third electrode 9 in magnitude, current in the electrical conductor 3 electrically connected to the second electrode 2 is changed, and accordingly, the second current in the first electrode 1 is changed into the third current. When the flexible substrate 5 is bent forward, at least one electrical conductor 3 is disconnected with the third electrode 9, and is also disconnected with the second electrode 2, thus current in the electrical conductor 3 disconnected with both the second electrode 2 and the third electrode 9 is changed into zero, and accordingly, the second current in the first electrode 1 is changed into the fourth current.

By taking the case that the number of the electrical conductors 3 is eight as an example, the third current may have 255 different values (the third current is not equal to the second current), the fourth current may accordingly have 255 different values (the fourth current is not equal to the second current), and any one of the current values of the third current is different from any one of the current values of the fourth current. Therefore, in the present embodiment, the current detecting unit 10 can detect 511 different current values in total (one current value of the second current, 255 different current values of the third current, and 255 different current values of the fourth current).

In the present embodiment, connections between the electrical conductors 3 and the second electrode 2 and the third electrode 9, corresponding to the second current, the third currents of different magnitudes and the fourth currents of different magnitudes, may be obtained through experiments in advance, and a current-position correspondence table may be generated accordingly. After the current detecting unit 10 detects the third or fourth current, the connections between the respective electrical conductors 3 and the second electrode 2 and the third electrode 9 can be known by looking up the current-position correspondence table, and bent position and bent direction can be determined based on the connections.

In the present embodiment, preferably, the third voltage is less than the second voltage, and both the third voltage and the second voltage are greater than the first voltage. In this case, all of the values of the third current are greater than that of the second current, all of the values of the fourth current are less than that of the second current, and consequently, any one of the current values of the third current is different from any one of the current values of the fourth current. Embodiment 2 of the present invention provides a bending action recognition device which comprises: a first electrode, a second electrode, a third electrode, a current detecting unit and a plurality of electrical conductors. When the flexible substrate is not bent, the second current is generated in the first electrode; when the flexible substrate is bent backward, the second current in the first electrode is changed into the third current; when the flexible substrate is bent forward, the second current in the first electrode is changed into the fourth current. The technical solution of the present invention uses the current detecting unit to detect the third or fourth current in the first electrode, and recognizes bent portion and bent direction of the flexible substrate according to the current value of the detected third or fourth current, thereby recognizing the bending action of the flexible substrate.

Embodiment 3

Embodiment 3 of the present invention provides a flexible display device, which comprises a flexible display panel and a bending action recognition device, the bending action recognition device is the bending action recognition device provided in the above Embodiment 1 or Embodiment 2, and specific content thereof may refer to the description in the above Embodiment 1 or Embodiment 2 and will not be described repeatedly herein.

Embodiment 3 of the present invention provides a flexible display device, which comprises a flexible display panel and a bending action recognition device, the technical solution of the present invention uses the bending action recognition device to recognize bent portion on the flexible display panel so that the flexible display panel performs, based on the recognized bent portion, corresponding action, for example, functions such as zooming in or out a photo, lock or unlock screen, adjusting volume, and the like.

It can be understood that, the above implementations are merely exemplary implementations used for explaining the principle of the present invention, but the present invention is not limited thereto. For those skilled in the art, various modifications and improvements may be made without departing from the spirit and essence of the present invention, and these modifications and improvements are also deemed as falling within the protection scope of the present invention.

The invention claimed is:

1. A bending action recognition device, comprising a first electrode, a second electrode, a current detecting unit and a plurality of electrical conductors, wherein the first electrode, the second electrode and the electrical conductors are all arranged on the back of a flexible substrate, the first electrode is located at an edge region of the flexible substrate and is frame-shaped, the second electrode is located at a center region of the flexible substrate, a first voltage is applied on the first electrode, a second voltage is applied on the second electrode, first ends of all the electrical conductors are connected to the first electrode, and a second end of each of the electrical conductors is movable relative to the flexible substrate, different electrical conductors are located at different positions on the flexible substrate, and different electrical conductors have different resistance values;

the bending action recognition device is configured in such a manner that when the flexible substrate is bent backward, at least one electrical conductor is electrically connected to the second electrode, and a first current is generated on the first electrode and the second electrode, wherein different electrical conductors electrically connecting to the second electrode produce different current values for the first current; and the current detecting unit is connected to the first electrode or the second electrode, the current detecting unit is used for detecting the first current on the first electrode or the second electrode, and the bending action recognition device recognizes bent portion of the flexible substrate according to the current value of the first current detected by the current detecting unit.

2. The bending action recognition device according to claim 1, further comprising: a third electrode, which is arranged on the back of the flexible substrate and is located between the first electrode and the second electrode, wherein, a third voltage is applied on the third electrode, and the third voltage is not equal to the second voltage, and the current detecting unit is connected to the first electrode;

when the flexible substrate is not bent, the electrical conductors are electrically connected to the third electrode, and a second current is generated in the first electrode;

when the flexible substrate is bent backward, at least one electrical conductor is disconnected with the third electrode and is electrically connected to the second electrode, the second current in the first electrode is changed into a third current, and when different electrical conductors are electrically connected to the second electrode, the third current has different current values;

when the flexible substrate is bent forward, at least one electrical conductor is disconnected with both the third electrode and the second electrode, the second current in the first electrode is changed into a fourth current, and when different electrical conductors are disconnected with both the third electrode and the second electrode, the fourth current has different current values; and the bending action recognition device recognizes bent portion and bent direction of the flexible substrate according to the current value of the third current or the fourth current detected by the current detecting unit.

3. The bending action recognition device according to claim 2, wherein, the third voltage is less than the second voltage, and both the third voltage and the second voltage are greater than the first voltage.

4. The bending action recognition device according to claim 2, wherein, the third electrode is frame-shaped.

5. The bending action recognition device according to claim 2, wherein, the bending action recognition device recognizes bent portion of the flexible substrate based on a predetermined look-up table.

6. The bending action recognition device according to claim 1, wherein, the second electrode comprises: a plurality of second sub-electrodes having the same number as the electrical conductors, and the second sub-electrodes extend towards corresponding electrical conductors, respectively.

7. The bending action recognition device according to claim 6, wherein, the electrical conductors are bar-shaped.

8. The bending action recognition device according to claim 7, wherein, the number of the electrical conductors is eight, the first ends of four of the electrical conductors are respectively connected to four vertices of the frame-shaped first electrode, the first ends of the other four electrical conductors are respectively connected to four midpoints on four sides of the frame-shaped first electrode, and second ends of the eight electrical conductors all point to the second electrode.

9. The bending action recognition device according to claim 1, further comprising limiting stoppers having the same number as the electrical conductors, wherein, the electrical conductors are in one-to-one correspondence with the limiting stoppers, the limiting stoppers are arranged on the back of the flexible substrate, a limiting groove is arranged on one side of each limiting stopper away from the flexible substrate, and the electrical conductors are located in the limiting grooves.

10. The bending action recognition device according to claim 9, wherein, the limiting stoppers are made of a flexible and insulating material, and the electrical conductors are made of a hard and conductive material.

11. The bending action recognition device according to claim 1, wherein, the second electrode is circular.

12. The bending action recognition device according to claim 1, wherein, the bending action recognition device recognizes bent portion of the flexible substrate based on a predetermined look-up table.

13. A flexible display device, comprising the bending action recognition device according to claim 1.

* * * * *